(12) United States Patent
Kim et al.

(10) Patent No.: US 7,419,759 B2
(45) Date of Patent: Sep. 2, 2008

(54) PHOTORESIST COMPOSITION AND METHOD OF FORMING A PATTERN USING THE SAME

(75) Inventors: Kyoung-Mi Kim, Anyang-si (KR); Jae-Ho Kim, Yongin-si (KR); Yeu-Young Youn, Seoul (KR); Youn-Kyung Wang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 335 days.

(21) Appl. No.: 11/138,360

(22) Filed: May 27, 2005

(65) Prior Publication Data

US 2005/0277056 A1    Dec. 15, 2005

(30) Foreign Application Priority Data

May 27, 2004    (KR)    ............... 10-2004-0037634

(51) Int. Cl.
*G03C 1/76* (2006.01)
*G03C 1/492* (2006.01)
*G03C 1/494* (2006.01)
*G03C 5/00* (2006.01)

(52) U.S. Cl. ............ 430/270.1; 430/322; 430/323; 430/325; 430/914; 430/927; 430/904; 430/905

(58) Field of Classification Search ............ 430/270.1, 430/322, 323, 325, 914, 927, 904–905
See application file for complete search history.

(56) References Cited

U.S. PATENT DOCUMENTS

| 6,479,211 B1 * | 11/2002 | Sato et al. ............... 430/270.1 |
| 7,235,342 B2 * | 6/2007 | Li et al. ................... 430/270.1 |

FOREIGN PATENT DOCUMENTS

| JP | 06-324488 | 11/1994 |
| JP | 11-202479 | 7/1999 |
| KR | 1995-012148 | 5/1995 |
| WO | WO 01/95034 A1 | 12/2001 |

\* cited by examiner

*Primary Examiner*—Geraldina Visconti
(74) *Attorney, Agent, or Firm*—Volentine & Whitt, PLLC (57) ABSTRACT

The photoresist composition of the present invention includes a solvent mixture, a resin, a photo acid generator, and a quencher, the solvent mixture comprising a first solvent containing an ether compound and a second solvent having a polarity stronger than the first solvent, wherein an amount of the first solvent is in a range of about 61% to about 79% by weight, and an amount of the second solvent is in a range of about 21% to about 39% by weight based on a total weight of the solvent mixture.

17 Claims, 8 Drawing Sheets

PHOTORESIST COMPOSITION AND METHOD OF FORMING A PATTERN USING THE SAME

BACKGROUND OF THE INVENTION

1. Field of the Invention

The present invention generally relates to a photoresist composition, and a method of forming a pattern on a semiconductor device using the same. More particularly, the present invention generally relates to a photoresist composition for forming a photoresist film on a substrate, and a method of forming a photoresist pattern by a photolithography process.

A claim of priority is made to Korean Patent Application No. 2004-37634 filed on May 27, 2004, the content of which is herein incorporated by reference in its entirety.

2. Description of the Related Art

In general, a semiconductor device is fabricated through a series of unit processes such as a layer coating, a patterning of the layer, and a metal wiring.

In general, a semiconductor device pattern is formed by a photolithography process. The photolithography process generally includes a cleaning process, a surface treatment process, a photoresist coating process, an aligning process, an exposing process, and a developing process.

During the photoresist coating process, a photoresist material is coated on a substrate such as a silicon substrate to form a photoresist film. In the aligning process, a photo mask on which an electronic circuit pattern is formed is arranged over the photoresist film. During the exposing process, illuminating light having wavelength to which the photoresist film is sensitive thereto to cause a photochemical reaction is irradiated thereon. Molecular structures of the photoresist film are selectively changed in accordance with the irradiated illuminating light. Then the developing process selectively removes reacted portions of the photoresist film to thereby form a photoresist pattern.

In general, a photoresist material is classified as a positive type and a negative type in accordance with a molecular reaction to light irradiated thereto. When selected areas of the positive photoresist are exposed to light, high molecular compounds of the exposed portions are converted into low molecular compounds, which are more soluble to a developing solution than an unexposed portions thereof. The exposed portions of the photoresist are readily removed from the substrate.

In contrast, when selected areas of the negative photoresist are exposed to light, low molecular compounds are converted into high molecular compounds to thereby have lower solubility to a developing solution than unexposed portions. The unexposed portions of the photoresist are readily removed from the substrate. As a result, the exposed portions remain on the substrate, and the unexposed portions are removed from the substrate after the developing process to thereby form the photoresist pattern.

Subsequently, various underlying layers formed under the photoresist film are selectively removed using the photoresist pattern as an etching mask. Afterwards, the photoresist pattern is removed from the substrate to form a semiconductor pattern on the substrate.

A minimal line width of the photoresist pattern or the semiconductor pattern is determined in accordance with a resolution capability of an exposing system, and the resolution capability of the exposing system is determined by the wavelength of illuminating light. In general, if the resolution of the exposing system is high, the wavelength of the illuminating light is short. That is, a short wavelength of the illuminating light is required to form a fine photoresist pattern.

The resolution of the exposing system is determined by the following equation 1.

$$R = K_1 NA/\lambda \qquad (1)$$

Wherein $\lambda$ denotes a wavelength of illuminating light; R denotes a resolution limit of the exposing system; $K_1$ denotes a proportional constant; and, NA denotes a numerical aperture for a lens used in the exposing system. According to equation (1), wavelength $\lambda$ of the illumination light and proportional constant $K_1$ must be small, and the numerical aperture of the lens must be large to increase the resolution of the exposing system. Among these factors, changing wavelength $\lambda$ is most widely utilized to increase the resolution of the exposing system.

Examples of the illumination light include a G-line light having a wavelength of about 436 nm, an I-line light having a wavelength of about 365 nm, a deep ultraviolet (DUV) light having a wavelength of about 248 nm, and an argon fluoride (ArF) light having a wavelength of about 193 nm. Although the DUV light includes a KrF light as well as the ArF light in view of the optical technology, the KrF light will be referred to as the DUV light in the present specification. The KrF light has a wavelength of about 248 nm.

U.S. Pat. Nos. 6,121,412 and 5,521,052, for example, disclose photoresist compositions having good solubility and maintenance stability without precipitation of photosensitive ingredients.

In general, a photoresist composition includes a polymer, a quencher, a photo acid generator, and a photoresist solvent.

The polymer, which is widely referred to as a resin, is a chemical compound in which two or more monomers combine to form compound molecules that contain repeating structural units. The polymer is the residual substance of the photoresist pattern remaining after the developing process. Light dissolves photo acid generator in the photoresist solvent. The photo acid functions as a catalyst during a chemical reaction to convert the molecular structure of the polymer. The photoresist solvent is a mixture of polar and non-polar solvents. The photoresist solvent also controls viscosity of the photoresist composition.

DUV light and ArF light have been frequently utilized to manufacture highly integrated and high performing semiconductor devices. As described above, the photoresist composition sensitive to the DUV light (DUV photoresist composition) is quite different from the photoresist composition sensitive to the ArF light (ArF photoresist composition). However in general, the solvents used for the DUV photoresist composition and the ArF photoresist composition are substantially the same.

The ArF photoresist composition has relatively poor solubility as compared with the DUV photoresist composition when using the same solvents, because the ArF photoresist composition is hydrophobic. Accordingly, when the ArF photoresist film is exposed to air, the resin dissolved in the solvent precipitates in very short time. The precipitated resin gathers around an injection nozzle and is injected onto a surface of a substrate during a coating process. The precipitated resin causes defects on the substrates.

The precipitated resin is a problem that must be solved to further the developments in the manufacturing of the semiconductor device.

SUMMARY OF THE INVENTION

According to an exemplary embodiment of the present invention, there is provided a photoresist composition containing a solvent mixture, a resin, a photo acid generator, and a quencher, the solvent mixture further containing a first solvent containing an ether compound and a second solvent having a polarity stronger than the first solvent, wherein an amount of the first solvent is in a range of about 61% to about 79% by weight based on a total weight of the solvent mixture, and an amount of the second solvent is in a range of about 21% to about 39% by weight based on the total weight of the solvent mixture.

An embodiment of the present invention also discloses a photoresist composition containing a solvent mixture, a resin, a photo acid generator and a quencher, the solvent mixture further containing a first solvent of propylene glycol monomethyl ether acetate (PGMEA) and a second solvent having a stronger polarity than the first solvent, wherein a weight ratio between the first solvent and the second solvent is in a range of about 7:2 to about 7:4.

A method of forming a photoresist pattern includes coating a photoresist composition onto a substrate to form a photoresist film, the photoresist composition including a solvent mixture, a resin, a photo acid generator, and a quencher, wherein the solvent mixture comprises a first solvent having an ether compound and a second solvent having a polarity stronger than the first solvent, and an amount of the first solvent is in a range of about 61% to about 79% by weight based on a total weight of the solvent mixture, and an amount of the second solvent is in a range of about 21% to about 39% by weight based on the total weight of the solvent mixture, selectively exposing the photoresist film to illuminating light, and developing the exposed photoresist film.

An embodiment of the present invention, a method of forming a photoresist pattern includes coating a photoresist composition onto a substrate to form a photoresist film, the photoresist composition including a solvent mixture, a resin, a photo acid generator, and a quencher, wherein the solvent mixture comprising a first solvent of propylene glycol monomethyl ether acetate (PGMEA) and a second solvent having a stronger polarity than the first solvent, wherein a weight ratio between the first solvent and the second solvent is in a range of about 7:2 to about 7:4, selectively exposing the photoresist film to illuminating light, and developing the exposed photoresist film.

BRIEF DESCRIPTION OF THE DRAWINGS

The above and other aspects of the present invention will become readily apparent by reference to the following detailed description in conjunction with the accompanying drawings, in which.

DESCRIPTION OF THE EMBODIMENTS

The present invention now will be described more fully hereinafter with reference to the accompanying drawings in which exemplary embodiments of the present invention are shown.

Photoresist Composition

A photoresist composition of the present invention includes a solvent mixture, a resin applicable to a photoresist material, a photo acid generator, and a quencher. The solvent mixture includes a first solvent having an ether compound and a second solvent having a polarity stronger than the first solvent. An amount of the first solvent is in a range of about 61% to about 79% by weight, and an amount of the second solvent is in a range of about 21% to about 39% by weight based on a total weight of the solvent mixture.

The solvent mixture is a mixture of polar solvents having different polarities. The resin is a residual substance of a photoresist pattern remaining after the developing process. The photo acid generator is dissolved by light and generates strong acid.

In the present invention, the solvent mixture includes a first solvent having an ether compound and a second solvent. The first solvent preferably includes propylene glycol monomethyl ether (PGME), and propylene glycol monomethyl ether acetate (PGMEA). These solvents can be used alone or in a mixture thereof. The second solvent is preferably an ester-based chemical, a ketone-based chemical, or a mixture thereof. The ester-based chemical preferably includes ethyl lactate (EL) and methyl 2-hydroxybutyrate (HBM). The ketone-based chemical preferably includes cyclohexanone, heptanone, and lactone. These solvents can be used alone or in a mixture thereof.

When the first solvent is less than about 61% by weight and the second solvent is more than about 39% by weight in a photoresist composition, the solubility of the photoresist composition is improved. However, the viscosity of the photoresist composition excessively increases creating a poor photoresist pattern profile. In contrast, when the first solvent is more than about 79% by weight and the second solvent is less than about 21% by weight in a photoresist composition, the solubility of the photoresist composition decreases. Accordingly, the resin dissolved into the solvent mixture precipitates and gathers around an injection nozzle, which creates defects on a photoresist film. Therefore, the amount of the first solvent is preferably in a range of about 61% to about 79% by weight and an amount of the second solvent is preferably in a range of about 21% to about 39% by weight based on a total weight of the solvent mixture. Alternatively, the first solvent and the second solvent may have a weight ratio in a range of about 7:2 to about 7:4.

To describe the present invention in different measuring units, if the amount of the first solvent is less than about 15 parts by weight per with respect to 10 parts by weight of the second solvent, the viscosity of the photoresist composition increases. If the amount of the first solvent is more than about 40 parts by weight per (with respect to) 10 parts by weight of the second solvent, an evaporation rate of the solvent mixture increases.

The first and second solvents have different viscosity with respect to each other; thus, the first and second solvents are preferably mixed with each other such that a viscosity of the solvent mixture is in a range of about 1.47 cP to about 1.67 cP while satisfying the above weight ratio for the first and second solvents. More preferably, the first and second solvents are mixed with each other such that the viscosity of the solvent mixture is in a range of about 1.50 cP to about 1.58 cP. When the viscosity of the solvent mixture deviates from the above range, the coating property of the photoresist composition is decreased.

In addition, the first and second solvents are preferably mixed with each other such that the evaporation ratio of the solvent mixture is in a range of about 0.321 to about 0.339 while satisfying the above weight ratio for the first and second solvents. The evaporation ratio of the solvent mixture is measured with respect to the evaporation rate of a butyl acetate (BuOAc) solution. When the evaporation ratio of the solvent mixture deviates from the above evaporation ratio range, the coating property of the photoresist composition also decreases.

In the present invention, the photoresist composition preferably contains about 2% to about 7% by weight of a resin, about 0.1% to about 0.5% by weight of a photo acid generator, about 0.05% to about 0.3% by weight of a quencher, and about 92.2% to about 97.85% based on the total weight of a photoresist composition. More preferably, the photoresist composition contains about 4% to about 6% by weight of a resin, about 0.1% to about 0.5% by weight of a photo acid generator, about 0.05% to about 0.15% by weight of a quencher, and about 93.5% to about 95.8% by weight of the solvent mixture based on the total weight of a photoresist composition.

The resin preferably includes an acrylate-based material, a cyclo-olefin methacrylate-based material, and a cyclo-olefin-based material. More preferably, he resin includes a methacrylate-based material and a vinyl ether methacrylate-based material. All these resins can be used alone or in combinations thereof.

The photo acid generator preferably includes monophenyl sulfonium salt and triphenyl sulfonium salt. These photo acid generators can be used alone or in a mixture thereof.

The quencher preferably includes hydrogen chloride (HCl), a material having an ethyl group or an alcohol group, an ester compound, a ketone compound, an amine compound, an aldehyde compound, a phenol compound, water ($H_2O$), a fluorine-containing compound (or fluoride), a cyanic compound (or cyanide), a bromine-containing compound (or bromide), an oxo compound, and a nitro group-containing compound. These quenchers can be used alone or in a combination thereof.

Method of Forming a Photoresist Pattern

Hereinafter, a method of forming a photoresist pattern using the above photoresist composition according to an exemplary embodiment of the present invention will be described.

A photoresist composition is coated onto a substrate such as a silicon wafer to form a photoresist pattern on the substrate. The photoresist composition includes a solvent mixture, a resin, a photo acid generator, and a quencher. The solvent mixture includes a first solvent having an ether compound and a second solvent having a polarity stronger than the first solvent. The first solvent is in a range of about 61% to about 79% by weight and the second solvent is in a range of about 21% to about 39% by weight based on a total weight of the solvent mixture. The second solvent includes an ester-based material, a ketone-based material, or a mixture thereof. Then, the photoresist film is selectively exposed to illuminating light, and the exposed photoresist film is developed to thereby form a photoresist pattern.

The first and second solvents are preferably mixed with each other such that a viscosity of the solvent mixture is in a range of about 1.47 cP to about 1.67 cP. In addition, the first and second solvents are also preferably mixed with each other such that the evaporation ratio of the solvent mixture with respect to a BuOAc solution is in a range of about 0.321 to about 0.339.

If a soft baking and a post baking processes are performed on the photoresist film using a conventional process temperature of about 110° C., solvent mixture residue in the photoresist film increases. Accordingly, the substrate on which the photoresist pattern is formed in the present invention is soft baked at a temperature of about 110° C. to about 120° C. to improve adherence of the photoresist film to the substrate and to lower solvent mixture residue.

A mask pattern on which a circuit pattern is formed is positioned over the photoresist film, and illuminating light is irradiated through the mask pattern to the photoresist film to selectively expose the photoresist film. The illumination light preferably has a wavelength less than about 248 nm, and more preferably, has a wavelength less than about 193 nm. Such an illuminating light is an ArF light. However, the wavelength of the illumination light may be varied in accordance with processing conditions and requirements.

A post baking process is performed on the exposed photoresist film at a temperature of about 100° C. to about 110° C.

During the developing process, exposed portions of the photoresist film are highly soluble and easily removed, and unexposed portions of the photoresist film remains on the substrate to form the photoresist pattern. In subsequent processes, various wiring lines and semiconductor patterns for electrodes are sequentially formed on the substrate.

EXAMPLE 1

A PGMEA solvent and a cyclohexanone solvent were mixed at a weight ratio of 7.5:2.5, and a solvent mixture of 94.15 g was obtained. The evaporation ratio and viscosity of the obtained solvent mixture were 0.335 and 1.50 cP, respectively. A methacrylate resin of 5 g, a PAG of 0.25 g, and a quencher of 0.1 g were added into the obtained solvent mixture to thereby obtain a first solution. The first solution was filtered through a 0.2 μm membrane filter to obtain a first photoresist composition.

EXAMPLE 2

A PGMEA solvent and a cyclohexanone solvent were mixed at a weight ratio of 7:3, and a solvent mixture 94.15 g was obtained. The evaporation ratio and viscosity of the obtained solvent mixture were 0.330 and 1.54 cP, respectively. A methacrylate resin of 5 g, a PAG of 0.25 g, and a quencher of 0.1 g were added into the obtained solvent mixture to thereby obtain a second solution. The second solution was filtered through a 0.2 µm membrane filter to obtain a second photoresist composition.

EXAMPLE 3

A PGMEA solvent and a cyclohexanone solvent were mixed at a weight ratio of 6.5:3.5, and a solvent mixture of 94.15 g was obtained. The evaporation ratio and viscosity of the obtained solvent mixture were 0.325 and 1.58 cP, respectively. A methacrylate resin of 5 g, a PAG of 0.25 g, and a quencher of 0.1 g were added into the obtained solvent mixture to thereby obtain a third solution. The third solution was filtered through a 0.2 µm membrane filter to obtain a third photoresist composition.

COMPARATIVE EXAMPLE 1

Only a PGMEA solvent 94.15 g was used. The evaporation ratio and viscosity of the obtained solvent was 0.345 and 1.30 cP, respectively. A methacrylate resin of 5 g, a PAG of 0.25 g, and a quencher of 0.1 g were added into the solvent to thereby obtain a first comparative solution. The first comparative solution was filtered through a 0.2 µm membrane filter to obtain a first comparative photoresist composition.

COMPARATIVE EXAMPLE 2

A PGMEA solvent and a cyclohexanone solvent were mixed at a weight ratio of 9:1, and a solvent mixture of 94.15 g was obtained. The evaporation ratio and viscosity of the obtained solvent mixture were 0.342 and 1.38 cP, respectively. A methacrylate resin of 5 g, a PAG of 0.25 g, and a quencher of 0.1 g were added into the obtained solvent mixture to thereby obtain a second comparative solution. The second comparative solution was filtered through a 0.2 µm membrane filter to obtain a second comparative photoresist composition.

COMPARATIVE EXAMPLE 3

A PGMEA solvent and a cyclohexanone solvent were mixed at a weight ratio of 8:2, and a solvent mixture of 94.15 g was obtained. The evaporation ratio and viscosity of the obtained solvent mixture were 0.339 and 1.46 cP, respectively. A methacrylate resin of 5 g, a PAG of 0.25 g, and a quencher of 0.1 g were added into the obtained solvent mixture to thereby obtain a third comparative solution. The third comparative solution was filtered through a membrane filter of about 0.2 µm, to thereby obtain a third comparative photoresist composition.

COMPARATIVE EXAMPLE 4

A PGMEA solvent and a cyclohexanone solvent were mixed at a weight ratio of 6:4, and a solvent mixture of 94.15 g was obtained. The evaporation ratio and a viscosity of the obtained solvent mixture were 0.320 and 1.62 cP, respectively. A methacrylate resin of 5 g, a PAG of 0.25 g, and a quencher of 0.1 g were added into the obtained solvent mixture of 94.15 g to thereby form a fourth comparative solution. The fourth comparative solution was filtered through a 0.2 µm membrane filter to obtain a fourth comparative photoresist composition.

PHOTORESIST COMPOSITIONS EXPERIMENTS

Experiment 1

The first photoresist composition was exposed to air for about eight hours under clean conditions. Air temperature was about 25° C. After eight hours, some components of the first photoresist composition evaporated, and also change on a surface of the first photoresist composition occurred in a first test bottle 110 as shown in FIG. 1.

Figure 1:
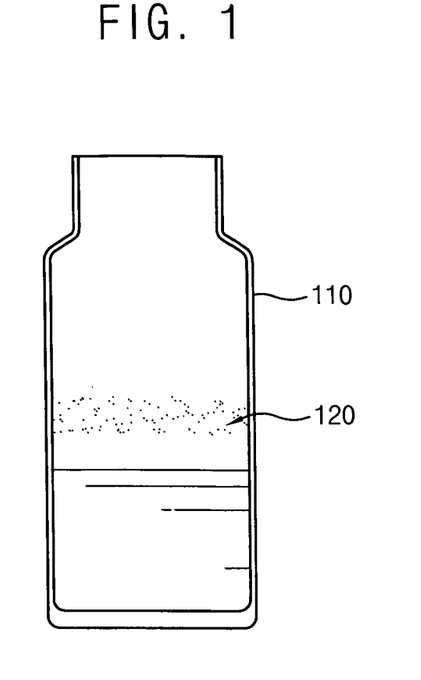
FIG. 1 is a schematic view illustrating results of Experiment 1 on a first photoresist composition.

Referring to FIG. 1, a first white band 120 was generated on an inner surface of first test bottle 110. However, the amount of first white band 120 was difficult to observe with the naked eye. An analysis on first white band 120 confirmed that it was the same material as the resin dissolved into the solvent mixture.

Experiment 2

Figure 2:
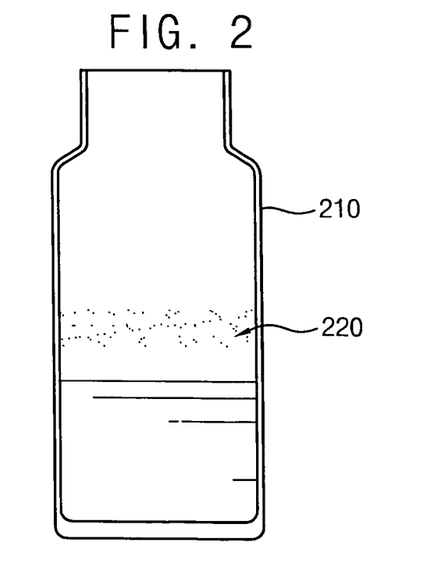
FIG. 2 is a schematic view illustrating results of Experiment 2 on a second photoresist composition.

The second photoresist composition was exposed in the same manner as Experiment 1, and also change on a surface of the second photoresist composition occurred in a second test bottle 210 as shown in FIG. 2.

Referring to FIG. 2, a second white band 220 was generated in very small amount on an inner surface of the second test bottle 210. However, the analysis on the second white band 220 confirmed that the amount of the second white band 220 was reduced to at least about 20% as compared with that of first white band 120.

Experiment 3

Figure 3:
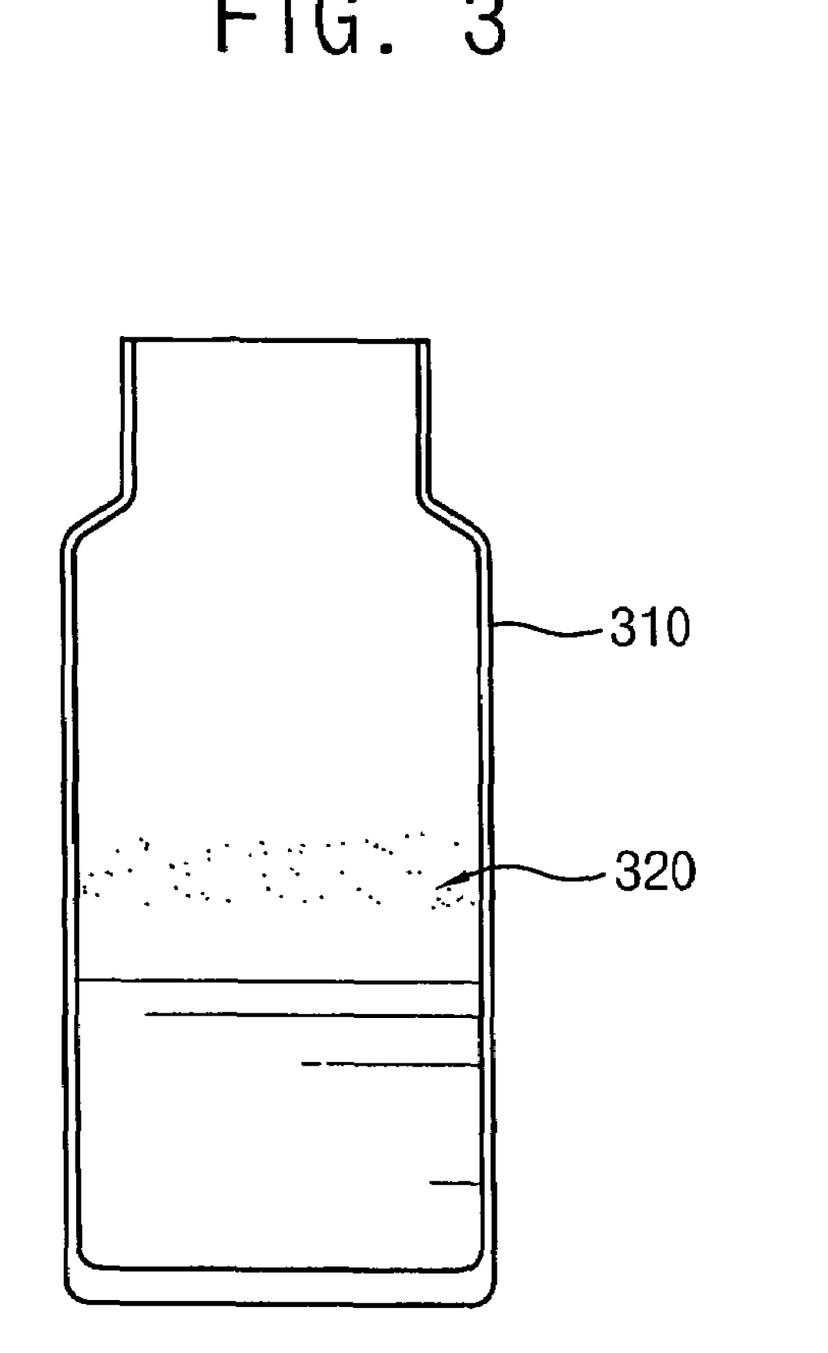
FIG. 3 is a schematic view illustrating results of Experiment 3 on a third photoresist composition.

The third photoresist composition was exposed in the same manner as Experiment 1, and also change on a surface of the third photoresist composition occurred in a third test bottle 310 as shown in FIG. 3.

Referring to FIG. 3, a third white band 320 was generated in very small amount on an inner surface of the third test bottle 310. However, the analysis on the third white band 320 confirmed that the amount of the third white band 320 was reduced to at least about 30% as compared with that of first white band 120. A reduction of at least 12.5% as compared with that of the second white band 220.

PHOTORESIST PATTERN EXPERIMENTS

Experiment 4

A substrate such as a semiconductor wafer having an anti-reflection layer thereon was rotated at about 900 rpm to about 4000 rpm, and the second photoresist composition was coated onto the rotating substrate to form a photoresist film. The photoresist film was formed into a photoresist pattern by sequential processes. Then, a picture of the substrate having the photoresist pattern thereon was obtained using a Stealth apparatus as shown in FIG. 4.

Figure 4:
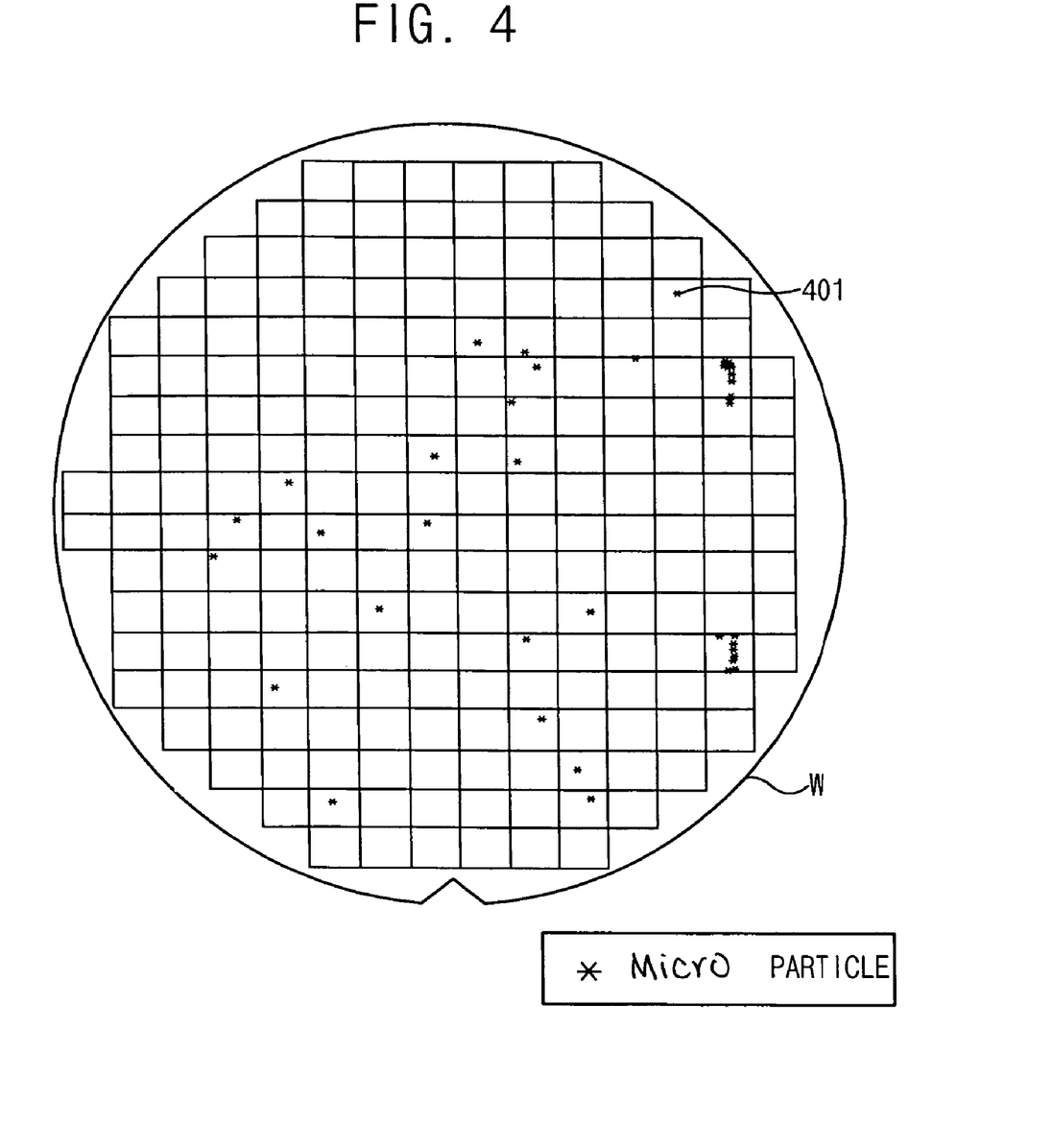
FIG. 4 is a picture illustrating a result of an analysis on a photoresist pattern using the second photoresist composition.

Referring to FIG. 4, the analysis on the photoresist pattern on a wafer W confirmed that only a few micro particles 401 having a size of no more than about 0.5 µm were found. The micro particles were the same material as that of the resin of the second photoresist composition.

In addition, the resin was not detected around an injecting nozzle, and thus confirming that the resin did not drip onto a surface of wafer W from the injecting nozzle.

Identical experiments were carried out on the first and third photoresist compositions, respectively, and each photoresist pattern was analyzed in the same manner. Experimental results of the first and third photoresist compositions were similar to the test result for the second photoresist composition.

PHOTORESIST COMPOSITIONS EXPERIMENTS

Comparative Experiment 1

Figure 5:
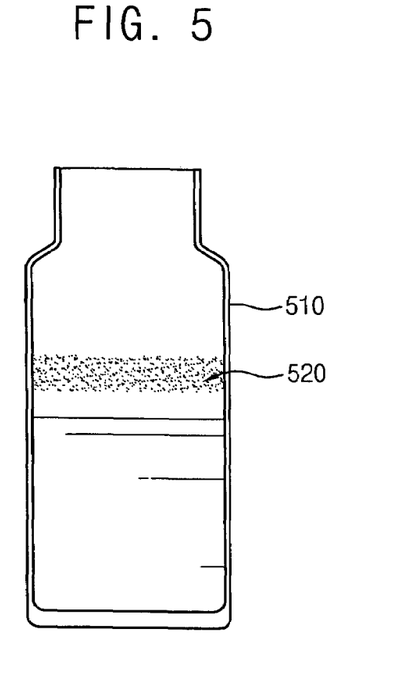
FIG. 5 is a schematic view illustrating results of Comparative Experiment 1 on a first comparative photoresist composition.

The first comparative photoresist composition was exposed in the same manner as Experiment 1, and also change on a surface of the first comparative photoresist composition occurred in a first comparative test bottle 510 as shown in FIG. 5.

Referring to FIG. 5, a first distinct white band 520 was generated on an inner surface of first comparative test bottle 510. An analysis on first distinct white band 520 confirmed that it was the same material as the resin dissolved into the solvent mixture. In addition, the analysis confirmed that the amount of first distinct white band 520 had increased to least about 90% as compared with that of first white band 120.

Comparative Experiment 2

Figure 6:
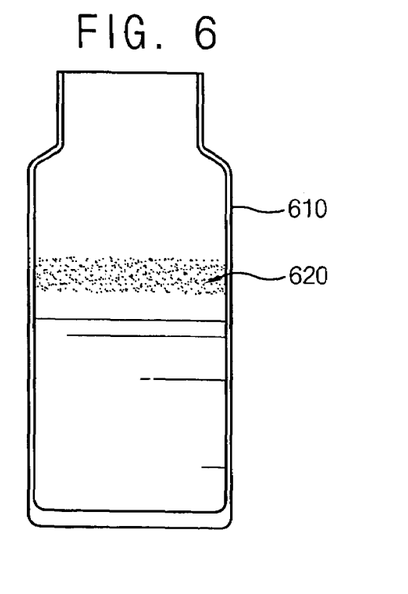
FIG. 6 is a schematic view illustrating results of Comparative Experiment 2 on a second comparative photoresist composition.

The second comparative photoresist composition was exposed in the same manner as Experiment 1, and also change on a surface of the second comparative photoresist composition occurred in a second comparative test bottle 610 as shown in FIG. 6.

Referring to FIG. 6, a second distinct white band 620 was generated on an inner surface of second comparative test bottle 610. An analysis on second distinct white band 620 confirmed that the amount of second distinct white band 620 had increased to at least about 80% as compared with that of first white band 120.

Comparative Experiment 3

Figure 7:
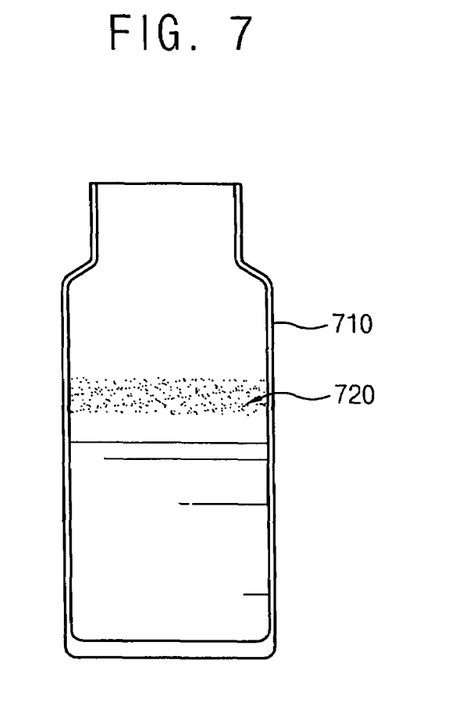
FIG. 7 is a schematic view illustrating results of Comparative Experiment 3 on a third comparative photoresist composition.

The third comparative photoresist composition was exposed in the same manner as Experiment 1, and also change on the surface of the third comparative photoresist composition occurred in a third comparative test bottle 710 as shown in FIG. 7.

Referring to FIG. 7, a third distinct white band 720 was generated on an inner surface of the third comparative test bottle 710. An analysis on the third distinct white band 720 confirmed that the amount of the third distinct white band 720 had increased to at least about 70% as compared with that of first white band 120.

Comparative Experiment 4

Figure 8:
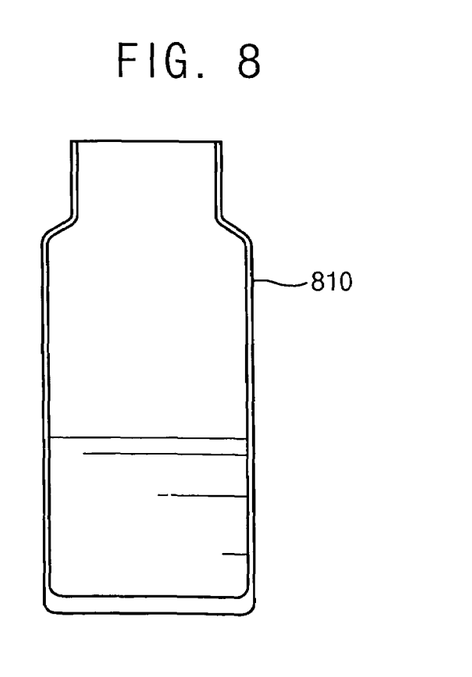
FIG. 8 is a schematic view illustrating results of Comparative Experiment 2 on a fourth comparative photoresist composition.

The fourth comparative photoresist composition was exposed in the same manner as Experiment 1, however, no change on the surface of fourth comparative photoresist composition occurred as shown in FIG. 8.

Referring to FIG. 8, no white band was observed on an inner surface of the fourth comparative test bottle 810 with the naked eye.

The above comparative experiments confirmed that as the amount of precipitated resin of the photoresist composition decreases, the weight ratio of the PGMEA solvent and the cyclohexanone solvent increases. In addition, the above comparative experiments confirmed that as the polarity of the solvent mixture increases the amount of the precipitated resin of the photoresist composition decreases.

PHOTORESIST PATTERN EXPERIMENTS

Comparative Experiment 5

A second comparative photoresist pattern was formed by the same manner as Experiment 4 using the second comparative photoresist composition.

Figure 9:
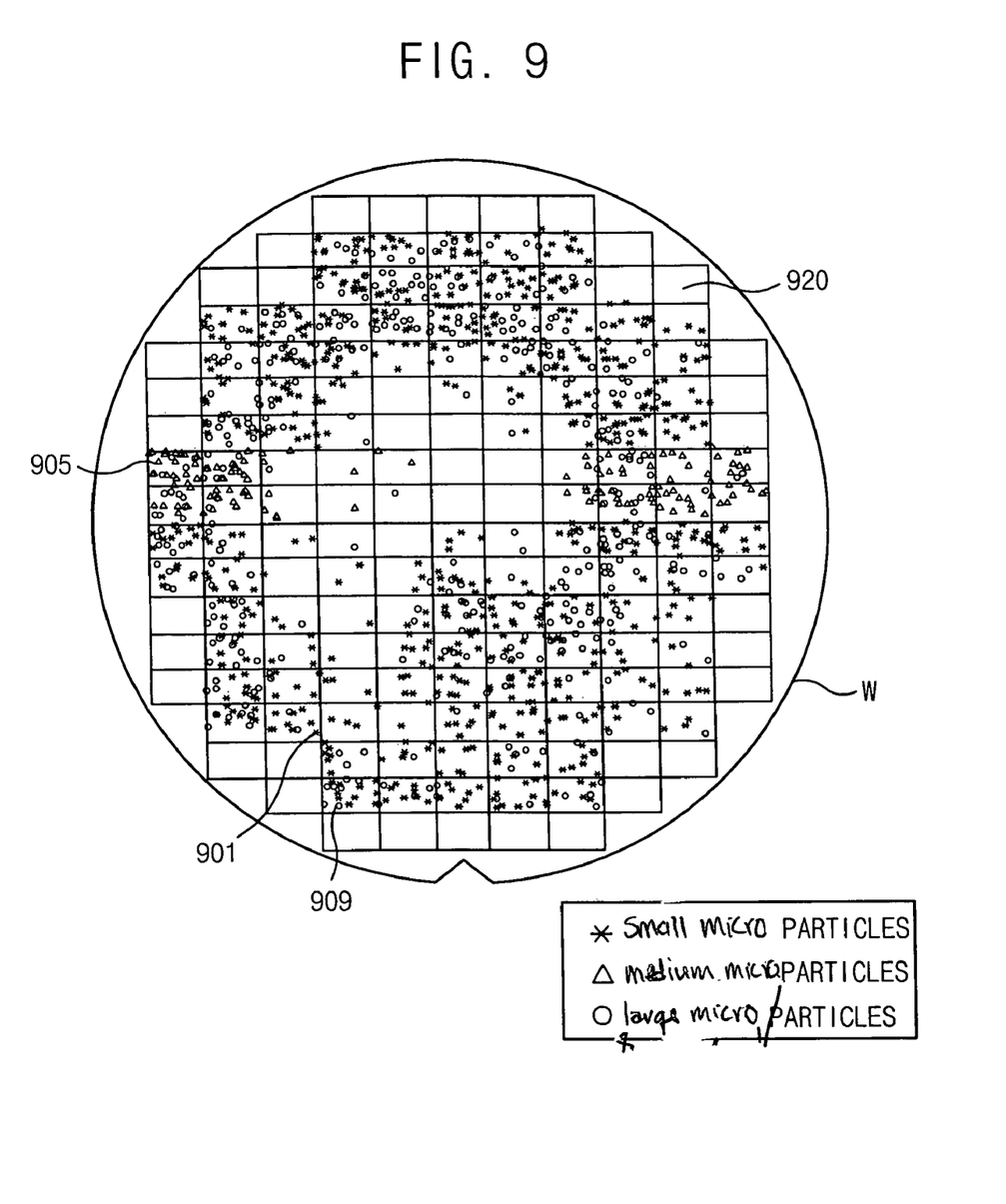
FIG. 9 is a picture illustrating a result of an analysis on second comparative photoresist pattern using the second comparative photoresist composition.

Referring to FIG. 9, various particles 901, 905 and 909 were distributed on an entire wafer W surface. Results of this experiment confirmed that the particles formed on the second comparative photoresist pattern had increased to at least about 80% as compared with the particles formed on the photoresist pattern shown in FIG. 4.

The particles formed on the second comparative photoresist pattern were classified in accordance with respective diameters. Small micro particles 901 have diameters no more than about 0.5 μm; medium micro particles 905 have diameters in a range between about 0.5 μm and about 1.0 μm; and large micro particles have diameters greater than about 1.0 μm. Enlarged images of the particles were obtained by using an electron microscope.

Figure 10A:
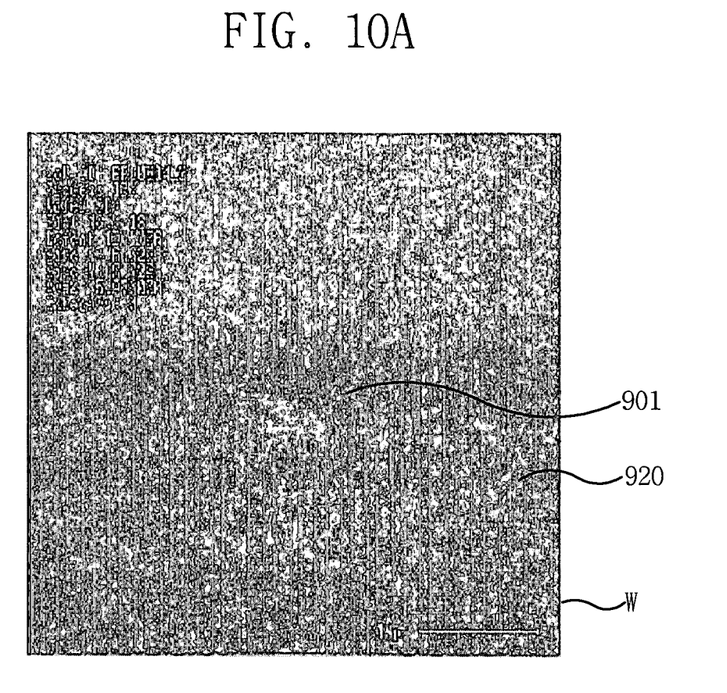
FIG. 10A is an enlarged picture illustrating a minute particle shown in FIG. 9 obtained by an electron microscope.
Figure 10B:
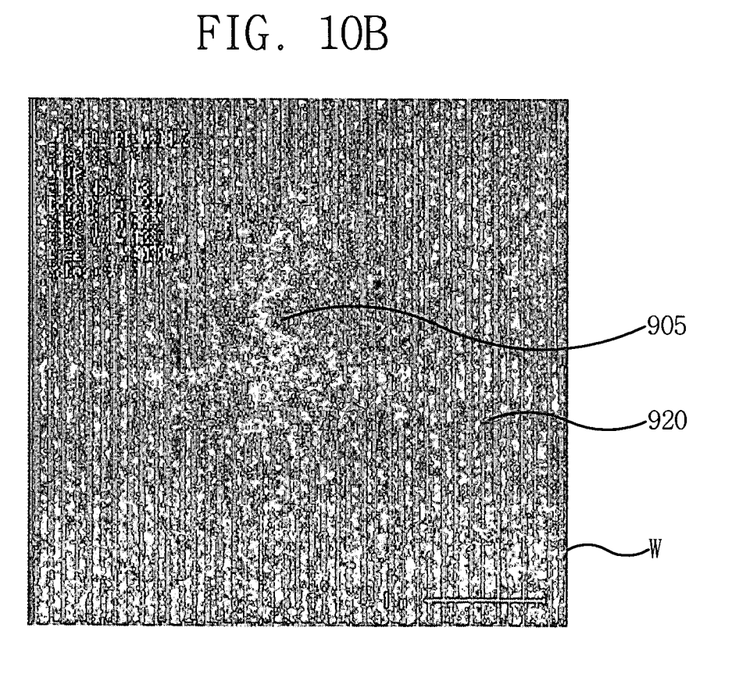
FIG. 10B is an enlarged picture illustrating a medium particle shown in FIG. 9 obtained by the electron microscope.
Figure 10C:
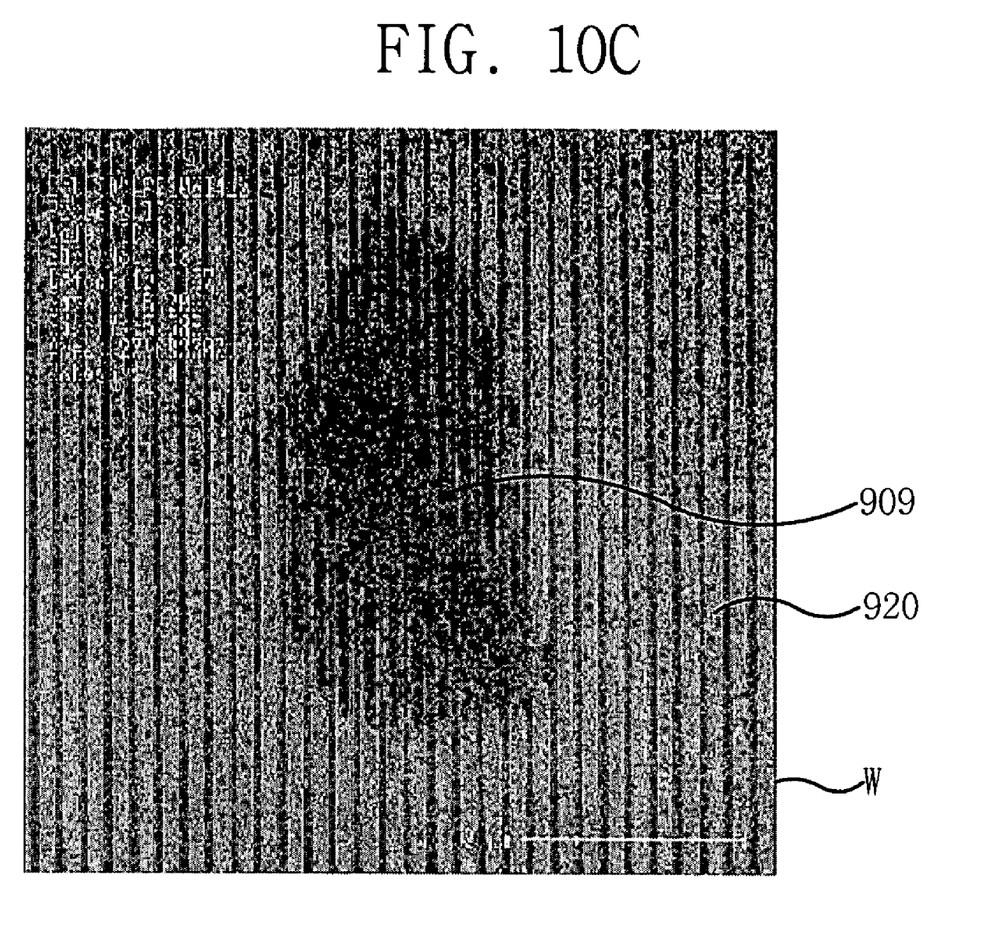
FIG. 10C is an enlarged picture illustrating a large particle shown in FIG. 9 obtained by the electron microscope.

As shown in FIG. 10A, minute particles 901 dripped onto the surface of wafer W. As shown in FIG. 10B, medium particles 905 dripped onto the surface of wafer W. As shown in FIG. 10C, large particles 909 dripped onto the surface of wafer W.

In addition, analyses confirmed that particles on the second comparative photoresist pattern were the same material as the resin of the second comparative photoresist composition, and the resin was also observed around an injection nozzle. Accordingly, it was concluded that the resin dripped onto the surface of wafer W.

If particles 901, 905, and 909 are found on a bit line pattern or on a word line pattern, they can cause serious failures such as a short circuit.

Identical experiments were carried out on the first and third comparative photoresist compositions, respectively, and the first and third comparative photoresist patterns were analyzed in the same manner. The experimental results showed that the first comparative photoresist pattern had more particles than the second comparative photoresist pattern, and the third comparative photoresist pattern had about the same amount particles as that of the second comparative photoresist pattern.

Photoresist patterns were formed on substrates using the first, second and third photoresist compositions and the first, second and third comparative photoresist compositions. However, a photoresist pattern using the fourth comparative photoresist composition did not form on a substrate. According to these results, it is inferred that the polarity of the fourth comparative photoresist composition exceeded a polarity limit sufficient to form the photoresist pattern. That is, when the solvent mixture was formed at the weight ratio of 6:4 between the PGMEA solvent and the cyclohexanone solvent, the polarity of the fourth comparative photoresist composition was too high. Accordingly, a solvent mixture having a weight ratio of 6:4 between the PGMEA solvent and the cyclohexanone solvent cannot be used as a photoresist composition even though there is an advantage in that the resin in the photoresist composition do not precipitate.

The soft and post baking processes were experimentally performed at a conventional baking temperature of about 110° C. to form a photoresist pattern respectively using the first, second and third photoresist compositions. The experimental results showed that solvent mixture residue in the photoresist pattern were abundant, whereby the pattern characteristics seriously deteriorated. However, when the soft and post baking processes were experimentally carried out at a temperature of about 115° C. using the first, second, and third photoresist compositions, the experimental results showed that solvent mixture residue on the photoresist pattern were minimized, and pattern characteristics of the photoresist pattern did not deteriorate.

Accordingly, it was concluded that reduction in the pattern characteristics due to an amount of the solvent mixture residue, which is dependent on the polarity of the photoresist composition, can be compensated by the baking temperature.

Table 1 shows experimental results of material characteristics on the photoresist composition and the photoresist pattern.

TABLE 1

| | Weight ratio | Evaporation ratio | Viscosity of a solvent mixture | Amount of extracted resin | Forming a pattern |
|---|---|---|---|---|---|
| Comparative experiment 1 | 10:0 | 0.345 | 1.30 | ◯ | ◯ |
| Comparative experiment 2 | 9:1 | 0.342 | 1.38 | ◯ | ◯ |
| Comparative experiment 3 | 8:2 | 0.339 | 1.46 | ◯ | ◯ |
| Comparative experiment 4 | 6:4 | 0.320 | 1.62 | X | X |
| Experiment 1 | 7.5:2.5 | 0.335 | 1.50 | Δ | ◯ |
| Experiment 2 | 7:3 | 0.330 | 1.54 | Δ | ◯ |
| Experiment 3 | 6.5:3.5 | 0.325 | 1.58 | X | ◯ |

In Table 1, the evaporation rate was measured with respect to the evaporation rate of a BuOAc solution. The amount of the precipitated resin was measured after exposing the photoresist composition to air for eight hours. "◯" represents that a large amount of the resin had precipitated, and "Δ" represents that the resin had precipitated to such a small amount it was difficult to observed with the naked eye. "X" represents that an extremely small amount of the resin had precipitated, which could not be observed with the naked eye. The amount of the precipitated resin may alternatively indicate a degree of failure when the resin precipitated around the injection nozzle. That is, "◯" may represent that the failure caused by the dripped resin is serious; "Δ" may represent that the failure caused by the dripped resin is normal, and "X" may represent that the failure is not serious or slight.

When the weight ratio between a relatively low polar solvent and a relatively high polar solvent is less than 8:2, the resin in the photoresist composition precipitates in large amounts. In addition, when the weight ratio between a relatively low polar solvent and a relatively high polar solvent is no less than 6:4, the polarity of the photoresist composition is exceedingly high, so that a profile of the photoresist pattern is poor. Accordingly, when the weight ratio between a relatively low polar solvent and a relatively high polar solvent is no more than 8:2 and no less than 6:4, the process failure due to the precipitated resin is minimized and the pattern profile of the photoresist pattern is fully satisfactory.

According to the present invention, the photoresist composition of the present invention has good sensitivity and resolution as well as heat resistance and solution stability. In addition, the resin in the photoresist composition does not precipitate around the injection nozzle, so that the process failure due to the precipitated resin is reduced. Therefore, a photoresist pattern formed using the photoresist composition of the present invention has a better profile as compared with a photoresist pattern using the conventional photoresist composition. A manufacturing efficiency is also improved when the photoresist composition of the present invention.

Although the exemplary embodiments of the present invention have been described, it is understood that the present invention should not be limited to these exemplary embodiments but various changes and modifications can be made by one skilled in the art within the scope of the present invention.

What is claimed is:

1. A photoresist composition comprising a solvent mixture, a resin, a photo acid generator, and a quencher, the solvent mixture comprising a first solvent containing an ether compound and a second solvent having a polarity stronger than the first solvent, wherein an amount of the first solvent is in a range of about 61% to about 79% by weight based on a total weight of the solvent mixture, and an amount of the second solvent is in a range of about 21% to about 39% by weight based on the total weight of the solvent mixture, wherein the first solvent includes at least one selected from the group consisting of propylene glycol monomethyl ether (PGME) and propylene glycol monomethyl ether acetate (PGMEA), and wherein the second solvent includes at least one selected from the group consisting of cyclohexanone, ethyl lactate, methyl 2-hydroxybutyrate, heptanone, lactone.

2. The photoresist composition of claim 1, wherein the amount of the first solvent is in a range of about 65% to about 75% by weight based on the total weight of the solvent mixture, and the amount of the second solvent is in a range of about 25% to about 35% by weight based on the total weight of the solvent mixture.

3. The photoresist composition of claim 1, wherein a viscosity of the solvent mixture is in a range of about 1.47 cP to about 1.6 cP.

4. The photoresist composition of claim 1, wherein the viscosity of the solvent mixture is in a range of about 1.50 cP to about 1.58 cP.

5. The photoresist composition of claim 1, wherein a ratio of an evaporation rate of the solvent mixture with respect to an evaporation rate of a butyl acetate solution is in a range of about 0.321 to about 0.339.

6. The photoresist composition of claim 1, wherein an amount of the resin is in a range of about 2% to about 7% by weight based on the total weight of the photoresist composition, an amount of the photo acid generator is in a range of about 0.1% to about 0.5% by weight based on the total weight of the photoresist composition, an amount of the quencher is in a range of about 0.05% to about 0.3% by weight based on the total weight of the photoresist composition, and an amount of the solvent mixture is in a range of about 92.2% to about 97.85% by weight based on the total weight of the photoresist composition.

7. The photoresist composition of claim 1, wherein an amount of the resin is in a range of about 4% to about 6% by weight based on the total weight of the photoresist composition, an amount of the photo acid generator is in a range of about 0.1% to about 0.5% by weight based on the total weight of the photoresist composition, an amount of the quencher is in a range of about 0.05% to about 0.15% by weight based on the total weight of the photoresist composition, and an amount of the solvent mixture is in a range of about 93.5% to about 95.8% by weight based on the total weight of the photoresist composition.

8. A photoresist composition comprising a solvent mixture, a resin, a photo acid generator and a quencher, the solvent mixture comprising a first solvent of propylene glycol monomethyl ether acetate (PGMEA) and a second solvent having a stronger polarity than the first solvent, wherein a weight ratio between the first solvent and the second solvent is in a range of about 7:2 to about 7:4, and wherein the second solvent includes at least one selected from the group consisting of cyclohexanone, ethyl lactate, methyl 2-hydroxybutyrate, heptanone and lactone.

9. A method of forming a photoresist pattern, comprising:
coating a photoresist composition onto a substrate to form a photoresist film, the photoresist composition including a solvent mixture, a resin, a photo acid generator, and a quencher, wherein the solvent mixture comprises a first solvent having an ether compound and a second solvent having a polarity stronger than the first solvent, and an amount of the first solvent is in a range of about 61% to about 79% by weight based on a total weight of the solvent mixture, and an amount of the second solvent is in a range of about 21% to about 39% by weight based on the total weight of the solvent mixture, wherein the first solvent includes at least one selected from the group consisting of propylene glycol monomethyl ether (PGME) and propylene glycol monomethyl ether acetate (PGMEA), and wherein the second solvent includes at least one selected from the group consisting of cyclohexanone, ethyl lactate, methyl 2-hydroxybutyrate, heptanone, lactone;
selectively exposing the photoresist film to illuminating light; and
developing the exposed photoresist film.

10. The method of claim 9, further comprising:
performing a soft baking process on the substrate at a temperature of about 110° C. to about 120° C.; and
performing a post baking process on the substrate at a temperature of about 100° C. to about 110° C.

11. The method of claim 9, wherein the illuminating light has a wavelength no more than about 193 nm.

12. The method of claim 9, wherein the amount of the first solvent is in a range of about 65% to about 75% by weight based on the total weight of the solvent mixture, and the amount of the second solvent is in a range of about 25% to about 35% by weight based on the total weight of the solvent mixture.

13. The method of claim 9, wherein an amount of the resin is in a range of about 2% to about 7% by weight based on the total weight of the photoresist composition, an amount of the photo acid generator is in a range of about 0.1% to about 0.5% by weight based on the total weight of the photoresist composition, an amount of the quencher is in a range of about 0.05% to about 0.3% by weight based on the total weight of the photoresist composition, and an amount of the solvent mixture is in a range of about 92.2% to about 97.85% by weight based on the total weight of the photoresist composition.

14. The method of claim 9, wherein an amount of the resin is in a range of about 4% to about 6% by weight based on the total weight of the photoresist composition, an amount of the photo acid generator is in a range of about 0.1% to about 0.5% by weight based on the total weight of the photoresist composition, an amount of the quencher is in a range of about 0.05% to about 0.15% by weight based on the total weight of the photoresist composition, and an amount of the solvent mixture is in a range of about 93.5% to about 95.8% by weight based on the total weight of the photoresist composition.

15. A method of forming a photoresist pattern, comprising:
coating a photoresist composition onto a substrate to form a photoresist film, the photoresist composition including a solvent mixture, a resin, a photo acid generator, and a quencher, wherein the solvent mixture comprising a first solvent of propylene glycol monomethyl ether acetate (PGMEA) and a second solvent having a stronger polarity than the first solvent, wherein a weight ratio between the first solvent and the second solvent is in a range of about 7:2 to about 7:4, and wherein the second solvent includes at least one selected from the group consisting of cyclohexanone, ethyl lactate, methyl 2-hydroxybutyrate, heptanone and lactone;
selectively exposing the photoresist film to illuminating light; and
developing the exposed photoresist film.

16. A photoresist composition comprising a solvent mixture, a resin, a photo acid generator, and a quencher, the solvent mixture including about 61% to about 79% by weight of propylene glycol monomethyl ether acetate (PGMEA) and about 21% to about 39% by weight of cyclohexanone based on a total weight of the solvent mixture.

17. The photoresist composition of claim 16, wherein the solvent mixture includes about 65% to about 75% by weight of PGMEA and about 25% to about 35% by weight of cyclohexanone based on a total weight of the solvent mixture.

* * * * *